(12) United States Patent
Saito et al.

(10) Patent No.: US 7,705,709 B2
(45) Date of Patent: Apr. 27, 2010

(54) VARISTOR AND LIGHT-EMITTING APPARATUS

(75) Inventors: Yo Saito, Tokyo (JP); Hiroyuki Sato, Tokyo (JP); Hitoshi Tanaka, Tokyo (JP); Makoto Numata, Tokyo (JP); Goro Takeuchi, Tokyo (JP)

(73) Assignee: TDK Corporation, Tokyo (JP)

( * ) Notice: Subject to any disclaimer, the term of this patent is extended or adjusted under 35 U.S.C. 154(b) by 670 days.

(21) Appl. No.: 11/717,041

(22) Filed: Mar. 13, 2007

(65) Prior Publication Data

US 2007/0223169 A1 Sep. 27, 2007

(30) Foreign Application Priority Data

Mar. 27, 2006 (JP) .............................. 2006-085918

(51) Int. Cl.
*H01C 7/10* (2006.01)

(52) U.S. Cl. ............................... 338/21; 338/20; 361/56

(58) Field of Classification Search .................... 338/20, 338/21, 22 R, 307, 309; 361/56, 118
See application file for complete search history.

(56) References Cited

U.S. PATENT DOCUMENTS

| | | | |
|---|---|---|---|
| 5,264,819 A * | 11/1993 | Nied et al. | 338/21 |
| 5,412,357 A * | 5/1995 | Nakamura et al. | 333/181 |
| 5,512,773 A * | 4/1996 | Wolf et al. | 257/471 |
| 5,565,838 A * | 10/1996 | Chan | 338/21 |
| 6,841,191 B2 * | 1/2005 | Wu | 427/79 |

FOREIGN PATENT DOCUMENTS

| | | |
|---|---|---|
| JP | A-49-009195 | 1/1974 |
| JP | A-02-043701 | 2/1990 |
| JP | A-2001-015815 | 1/2001 |
| JP | A 2002-246207 | 8/2002 |

OTHER PUBLICATIONS

Notice of Reasons for Rejection for Japanese Patent Application No. 2006-085918 issued Jul. 7, 2009.

* cited by examiner

*Primary Examiner*—Kyung Lee
(74) *Attorney, Agent, or Firm*—Oliff & Berridge, PLC (57) ABSTRACT

A varistor comprises a varistor portion, a metal portion, and buffer portion. The varistor portion has a varistor element body exhibiting a nonlinear current-voltage characteristic and two electrode portions. The metal portion has a thermal conductivity higher than that of the varistor element body. The buffer portion is disposed between the varistor portion and metal portion so as to be bonded to each of the varistor portion and metal portion and mainly composed of glass. The two electrode portions are arranged in the varistor element body so as to be electrically insulated from each other while exposing at least a portion of each thereof from an outer surface of the varistor element body. The metal portion and varistor portion are joined firmly to each other. The heat transmitted to the varistor can efficiently be diffused from the metal portion.

12 Claims, 7 Drawing Sheets

VARISTOR AND LIGHT-EMITTING APPARATUS

BACKGROUND OF THE INVENTION

1. Field of the Invention

The present invention relates to a varistor and a light-emitting apparatus comprising the varistor.

2. Related Background Art

Known as a varistor is one comprising a element body having a varistor element body exhibiting a nonlinear current-voltage characteristic and a pair of internal electrodes disposed so as to interpose a portion of the varistor element body between them, and a pair of terminal electrodes formed on an outer surface of the element body and respectively connected to their corresponding internal electrodes (see, for example, Japanese Patent Application Laid-Open No. 2002-246207).

SUMMARY OF THE INVENTION

Meanwhile, varistors can protect electronic devices such as semiconductor light-emitting devices and FET (Field Effect Transistor) against ESD (Electrostatic Discharge) surges when connected in parallel to the electronic devices. The electronic devices include those which generate heat during their operation. When the electronic devices attain a high temperature, they deteriorate their own characteristics, thereby affecting their operation. This makes it necessary to diffuse the generated heat efficiently.

Therefore, it is an object of the present invention to provide a varistor and a light-emitting apparatus which can efficiently diffuse heat.

The inventors considered that heat could efficiently be diffused from a varistor if a metal was bonded to a varistor element body and the heat transmitted to the varistor was diffused from the metal. However, when the metal and one outer face of the varistor element body are bonded to each other, the bonding strength therebetween may be so weak that the varistor element body and the metal peel off from each other. In this case, the heat transmitted from the metal to the varistor cannot be dissipated efficiently. For solving this problem, the inventors have invented a varistor having an enhanced bonding strength between the metal and varistor element body.

The varistor in accordance with the present invention comprises a varistor portion having a varistor element body exhibiting a nonlinear current-voltage characteristic and two electrode portions, a metal portion having a thermal conductivity higher than that of the varistor element body, and a buffer portion disposed between the varistor portion and metal portion so as to be bonded to each of the varistor portion and metal portion and mainly composed of glass; wherein the two electrode portions are arranged in the varistor element body so as to be electrically insulated from each other while exposing at least a portion of each thereof from an outer surface of the varistor element body.

In the varistor in accordance with the present invention, the buffer portion is bonded to each of the metal portion and varistor portion, whereby the buffer portion and metal portion can be bonded firmly to each other, while the buffer portion and varistor portion can be bonded firmly to each other. Therefore, the metal portion and varistor portion can be joined firmly to each other. Hence, the heat transmitted to the varistor can efficiently be diffused from the metal portion.

Preferably, the buffer portion contains a material adapted to produce a compound or alloy with a material contained in the varistor element body and produce a compound or alloy with a material contained in the metal portion.

In this case, the material contained in the buffer portion and the material contained in the metal portion produce a compound or alloy at a bonding surface between the buffer portion and metal portion. Therefore, the buffer portion and metal portion are bonded more firmly to each other. On the other hand, the material contained in the buffer portion and the material contained in the varistor element body produce a compound or alloy at a bonding surface between the buffer portion and varistor element body. Therefore, the buffer portion and varistor element body are bonded more firmly to each other. Hence, the metal portion and varistor portion can be joined more firmly to each other.

Preferably, the material contained in the buffer portion is Pd or Bi. In this case, Pd or Bi contained in the buffer portion produces respective compounds or alloys with the material contained in the metal portion and the material contained in the varistor element body, respectively. Therefore, the buffer portion is bonded more firmly to each of the varistor element body and metal portion. Hence, the varistor element body and metal portion can be joined more firmly to each other.

Preferably, a bonding surface of the metal portion with the buffer portion is a rough surface. In this case, the bonding strength between the metal portion and buffer portion is enhanced by an anchor effect. This can also alleviate a stress generated by the difference between the coefficient of expansion of the metal portion and that of the buffer portion at the time of heating.

The light-emitting apparatus in accordance with the present invention comprises a semiconductor light-emitting device and a varistor; the varistor comprising a varistor portion having a varistor element body exhibiting a nonlinear current-voltage characteristic and two electrode portions, a metal portion having a thermal conductivity higher than that of the varistor element body, and a buffer portion disposed between the varistor portion and metal portion so as to be bonded to each of the varistor portion and metal portion and mainly composed of glass; wherein the two electrode portions are arranged in the varistor element body so as to be electrically insulated from each other while exposing at least a portion of each thereof from an outer surface of the varistor element body; and wherein the semiconductor light-emitting device is connected physically and electrically to the two electrode portions so as to be connected in parallel to the varistor.

In the light-emitting apparatus in accordance with the present invention, the two electrode portions of the varistor are connected physically to the semiconductor light-emitting device, whereby the heat generated in the semiconductor light-emitting device is transmitted to the varistor through the two electrode portions. In the varistor, the buffer portion is bonded to each of the metal portion and buffer portion, whereby the buffer portion and metal portion can be bonded firmly to each other, while the buffer portion and the varistor portion can be bonded firmly to each other. Therefore, the metal portion and the varistor portion can be joined firmly to each other. Hence, the heat transmitted to the varistor can efficiently be diffused from the metal portion.

The present invention can provide a varistor and a light-emitting apparatus which can efficiently diffuse the heat can be provided.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Preferred embodiments of the present invention will be described below in detail with reference to the accompanying drawings. In the description the same elements or elements with the same functionality will be denoted by the same reference symbols, without redundant description.

First Embodiment

Figure 1:
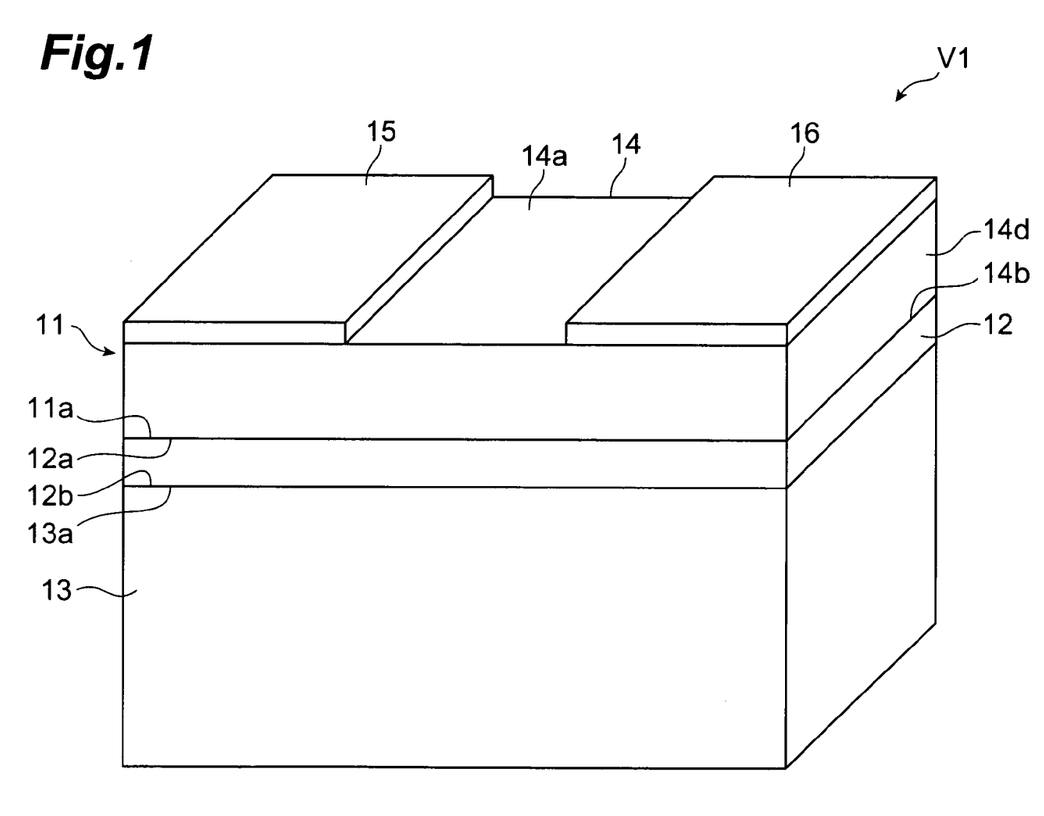
FIG. 1 is a schematic perspective view showing the varistor in accordance with the first embodiment.
Figure 2:
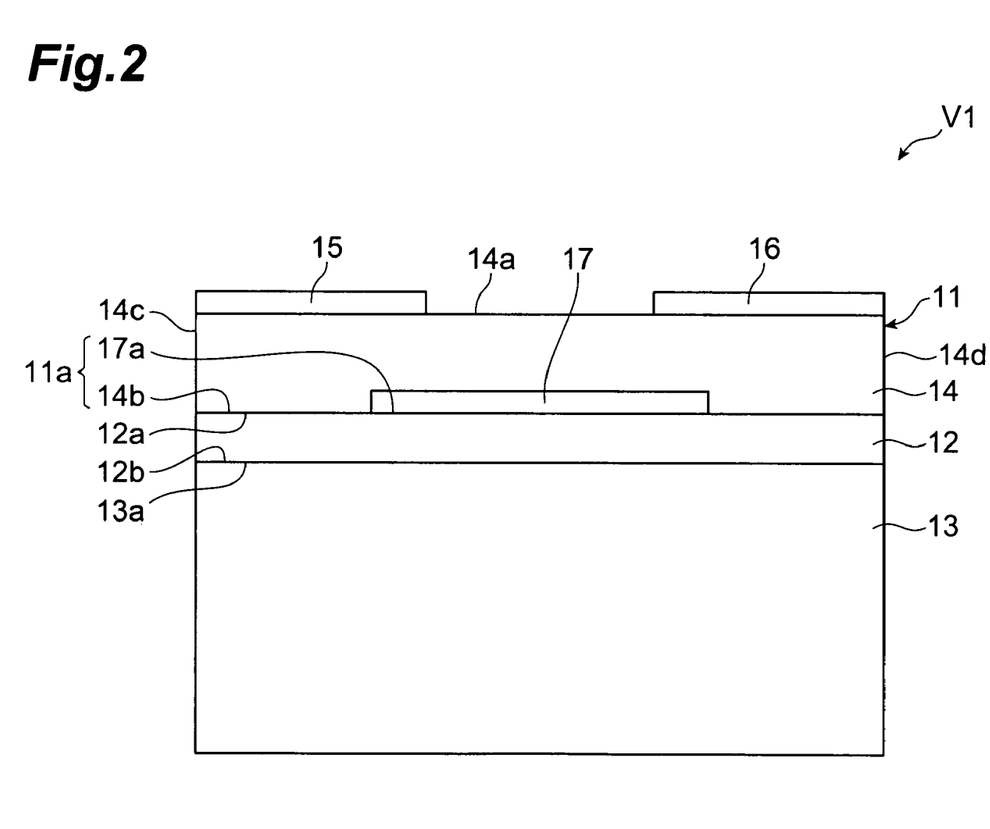
FIG. 2 is a schematic sectional view showing the varistor in accordance with the first embodiment.

The configuration of a varistor V1 in accordance with a first embodiment will be explained with reference to FIGS. 1 and 2. FIG. 1 is a schematic perspective view showing the varistor in accordance with the first embodiment. FIG. 2 is a schematic sectional view showing the varistor in accordance with the first embodiment. The varistor V1 has a substantially rectangular parallelepiped form and comprises a varistor portion 11, a buffer portion 12, and a metal portion 13. Each of the varistor portion 11 and metal portion 13 has a substantially rectangular parallelepiped form. The buffer portion 12 has principal faces 12a, 12b opposing each other. The principal face 12a is bonded to one face of the varistor portion 11, whereas the principal face 12b is bonded to one face of the metal portion 13.

The varistor portion 11 comprises a varistor element body 14, a first electrode portion 15, a second electrode portion 16, and a third electrode portion 17.

The varistor element body 14 has a face 14a (outer surface) and a face 14b which oppose each other, side faces 14c, 14d which are perpendicular to the faces 14a, 14b and oppose each other, and two side faces which are adjacent to the side faces 14c, 14d and oppose each other. The varistor element body 14 is a multilayer body formed by laminating a plurality of varistor layers. The actual varistor V1 is integrated to such an extent that no boundaries are discernible between the plurality of varistor layers. FIG. 2 shows a cross-sectional configuration of the varistor V1 in a cross section which is perpendicular to the faces 14a, 14d and passes the third electrode portion 17.

The varistor layer exhibits a nonlinear current-voltage characteristic. The varistor layer is mainly composed of ZnO, and contains Pr or Bi as an accessory component. The accessory component exists as an elemental metal or oxide in the varistor layers.

The first electrode portion 15 and second electrode portion 16 are arranged on the face 14a of the varistor element body 14. The first electrode portion 15 and second electrode portion 16 are arranged with a gap therebetween, while each having a rectangular form when seen in a direction perpendicular to the face 14a. The first electrode portion 15 extends to an edge of the face 14a so as to be exposed at the side face 14c and the two side faces adjacent to the side face 14c. The second electrode portion 16 extends to an edge of the face 14a so as to be exposed at the side face 14d and the two side faces adjacent to the side face 14d.

The first electrode portion 15 and second electrode portion 16 are arranged such that they are electrically insulated from each other. The first electrode portion 15 and second electrode portion 16 have their respective principal faces exposed from the face 14a of the varistor element body 14.

The third electrode portion 17 is arranged on the face 14b of the varistor element body 14. The third electrode portion 17 is arranged so as to oppose the first electrode portion 15 and second electrode portion 16 through the varistor element body 14. The third electrode portion 17 is arranged so as to be electrically insulated from the first electrode portion 15 and second electrode portion 16.

The third electrode portion 17 is arranged so as to have a rectangular form when seen in a direction perpendicular to the face 14b. One principal face 17a of opposing principal faces of the third electrode portion 17 is exposed from the face 14b of the varistor element body 14, whereas the other principal face and side faces are located within the varistor element body 14. The face 14b of the varistor element body 14 and the principal face 17a of the third electrode portion 17 exposed from the face 14b form one face 11a in the varistor portion 11. The face 11a is a surface opposing the face 14a of the varistor element body 14.

The first electrode portion 15 and second electrode portion 16 function as I/O terminals of the varistor V1. The first electrode portion 15 and third electrode portion 17 have respective regions opposing each other through the varistor element body 14 and overlapping each other when seen in a direction perpendicular to the face 14a. The second electrode portion 16 and third electrode portion 17 have respective regions opposing each other through the varistor element body 14 and overlapping each other when seen in a direction perpendicular to the face 14a.

The varistor element body 14, which is a region between the face 14a arranged with the first electrode portion 15 and second electrode portion 16 and the face 14b arranged with the third electrode portion 17, functions as an area exhibiting a nonlinear voltage characteristic in the varistor V1.

The buffer portion 12 has a rectangular form when seen in a direction perpendicular to the principal face 12a. The principal face 12a of the buffer portion 12 has the same form as that of the varistor portion 11, and is bonded to the face 11a of the varistor portion 11. Namely, the principal face 12a of the buffer portion 12 is bonded to the face 14b of the varistor element body 14 and the principal face 17a of the third electrode portion 17.

The buffer portion 12 is formed by a material mainly composed of glass. As an accessory component, the buffer portion 12 contains a material which produces a compound or alloy with a material contained in the varistor element body 14 and a compound or alloy with a material contained in the metal portion 13. In this embodiment, the buffer portion 12 contains Pd as an accessory component. When the varistor element body 14 contains Pr, a Pr—Pd alloy is formed at the bonding surface between the buffer portion 12 and varistor element body 14. When the varistor element body 14 contains Bi, a Bi—Pd alloy is formed at the bonding surface between the buffer portion 12 and varistor element body 14.

The buffer portion 12 and varistor element body 14 are bonded together by being fired in a state where the principal face 12a of the buffer portion 12 and the face 14b of the varistor element body 14 are aligned and in contact with each other. When the varistor element body 14 contains Pr, Pr contained in the varistor element body 14 and Pd contained in the buffer portion 12 produce a Pr—Pd alloy at the time of firing. When the varistor element body 14 contains Bi, Bi contained in the varistor element body 14 and Pd contained in the buffer portion 12 produce a Bi—Pd alloy at the time of firing. Producing an alloy between Pd contained in the buffer portion 12 and Pr or Bi contained in the varistor element body 14 can firmly bond the buffer portion 12 and varistor element body 14 to each other.

The principal face 12b of the buffer portion 12 has the same form as that of one face 13a of the metal portion 13 and is bonded to the face 13a. The metal portion 13 has a thermal conductivity higher than that of the varistor element body 14. The metal portion 13 contains Ag or Cu. When the metal portion 13 contains Ag, an Ag—Pd alloy is formed at the bonding surface between the buffer portion 12 and metal portion 13. When the metal portion 13 contains Cu, a Cu—Pd alloy is formed at the bonding surface between the buffer portion 12 and metal portion 13.

The buffer portion 12 and metal portion 13 are bonded together by being fired in a state where the principal face 12b of the buffer portion 12 and the face 13a of the metal portion 13 are aligned and in contact with each other. When the metal portion 13 contains Ag, Ag contained in the metal portion 13 and Pd contained in the buffer portion 12 produce an Ag—Pd alloy at the time of firing. When the metal portion 13 contains Cu, Cu contained in the metal portion 13 and Pd contained in the buffer portion 12 produce a Cu—Pd alloy at the time of firing. Producing an alloy between Pd contained in the buffer portion 12 and Ag or Cu contained in the metal portion 13 can firmly bond the buffer portion 12 and metal portion 13 to each other.

The face 13b of the metal portion 13 is an embossed rough surface. Therefore, the buffer portion 12 enters voids in the principal face 13b of the metal portion 13, so as to exhibit an anchor effect, thereby enhancing the bonding strength between the metal portion 13 and buffer portion 12. This can alleviate a stress generated by the difference between the coefficient of expansion of the metal portion 13 and that of the buffer portion 12 at the time of heating.

A process of making the varistor V1 having the configuration mentioned above will now be explained. First, ZnO which is a main component constituting the varistor element body 14 and a metal or oxide of Pr or Bi which is an accessory component are mixed at a predetermined ratio, so as to prepare a varistor material. Thereafter, an organic binder, an organic solvent, an organic plasticizer, and the like are added to the varistor material, so as to yield a slurry.

The slurry is applied onto a film, and then is dried, so as to yield a green sheet. Subsequently, the green sheet is formed with electrode portions corresponding to the first to third electrode portions 15 to 17. The electrode portions are formed by preparing a conductive paste in which an organic binder and an organic solvent are mixed with a metal powder mainly composed of Au or Pt particles, printing the conductive paste onto the varistor element body, and then drying it.

Next, green sheets formed with the electrode portions and green sheets formed with no electrode portions are laminated in a predetermined order, so as to form a sheet multilayer body. Thus obtained sheet multilayer body is cut into chips, so as to yield a green body corresponding to the varistor portion 11. Subsequently, the green body is heated at 180 to 400° C. for about 0.5 to 24 hours so as to remove the binder.

Next, a buffer portion 12 which is mainly composed of glass and contains Pd as an accessory component is prepared. On the other hand, a metal portion 13 having an embossed surface and containing Ag or Cu is prepared. The green body, buffer portion 12, and metal portion 13 are stacked in a predetermined order, and are simultaneously fired at a temperature of 800° C. or higher. This firing produces a Pr—Pd alloy or Bi—Pd alloy at the bonding surface between the buffer portion 12 and varistor element body 14, thereby firmly bonding the buffer portion 12 and varistor element body 14 to each other. Also, an Ag—Pd alloy or Cu—Pd alloy is produced at the bonding surface between the buffer portion 12 and metal portion 13, whereby the buffer portion 12 and metal portion 13 are firmly bonded to each other. Therefore, the varistor portion 11 and metal portion 13 are firmly joined to each other.

Meanwhile, when the varistor layer and a metal are directly bonded to each other, the bonding strength may be so weak that the varistor layer and the metal peel off from each other.

Since the varistor V1 in accordance with this embodiment is constructed such that each of the varistor portion 11 and metal portion 13 is bonded to the buffer portion 12, the buffer portion 12 and metal portion 13 can be bonded firmly to each other, while the buffer portion 12 and varistor portion 11 can be bonded firmly to each other. Therefore, the metal portion 13 and varistor portion 11 can be joined firmly to each other. Hence, the heat transmitted to the varistor V1 can efficiently be diffused from the metal portion 13.

In the varistor V1 in accordance with this embodiment, the buffer portion 12 contains Pd which produces an alloy with Pr or Bi contained in the varistor element body 14 and an alloy with Ag or Cu contained in the metal portion 13. Consequently, Pd contained in the buffer portion 12 and Pr or Bi contained in the varistor element body 14 produce an alloy. Therefore, the buffer portion 12 and varistor portion 11 are bonded firmly to each other. Also, Pd contained in the buffer portion 12 and Ag or Cu contained in the metal portion 13 produce an alloy at the bonding surface between the buffer portion 12 and metal portion 13. Therefore, the buffer portion 12 and metal portion 13 are bonded more firmly to each other. Hence, the varistor portion 11 and metal portion 13 can be joined more firmly to each other.

The principal face 12b, which is the bonding surface of the buffer portion 12 for the metal portion 13, is an embossed rough surface in the varistor V1 in accordance with this embodiment. This can enhance the bonding strength between the metal portion 13 and buffer portion 12. Also, a stress generated by the difference between the coefficient of expansion of the metal portion 13 and that of the buffer portion 12 at the time of heating can be alleviated.

Though a preferred embodiment of the present invention is explained in the foregoing, the present invention is not necessarily limited to the above-mentioned embodiment but can be modified in various ways within scopes not deviating from the gist thereof.

Though the varistor element body 14 contains Pr or Bi, the buffer portion 12 contains Pd, and the metal portion 13 contains Ag or Cu in the embodiment, this is not restrictive. The varistor element body 14 may contain both of Pr and Bi. It will be sufficient if the buffer portion 12 contains a material which produces respective compounds or alloys with a material contained in the varistor element body 14 and a material contained in the metal portion 13.

For example, the varistor element body 14 may be mainly composed of ZnO while containing Pr or Bi, the buffer portion 12 may contain Bi, and the metal portion 13 may contain Ag or Cu. In this case, ZnO contained in the varistor element body 14 and Bi contained in the buffer portion 12 react with each other at the time of firing, thereby producing a compound. Therefore, the varistor portion 11 and buffer portion 12 are bonded firmly to each other.

Ag or Cu contained in the metal portion 13 and Bi contained in the buffer portion 12 produce an Ag—Bi alloy or Cu—Bi alloy. Therefore, the metal portion 13 and buffer portion 12 are bonded firmly to each other. Hence, the varistor portion 11 and metal portion 13 can be joined firmly to each other.

The reaction by which ZnO contained in the varistor element body 14 and Bi contained in the buffer portion 12 produce a compound and the reaction by which Ag or Cu and Bi produce an alloy proceed at a temperature of less than 800° C. Namely, at a temperature of less than 800° C., the varistor portion 11 and buffer portion 12 can be bonded to each other, and the buffer portion 12 and metal portion 13 can be bonded to each other. In this case, after forming the varistor portion 11 by firing the above-mentioned green body, the varistor portion 11, buffer portion 12, and metal portion 13 are stacked and heated at a temperature of less than 800° C., whereby the varistor portion 11 and buffer portion 12 can be bonded together, and the buffer portion 12 and metal portion 13 can be bonded together.

For example, the varistor element body 14 may be mainly composed of ZnO while containing Pr or Bi, the buffer portion 12 may contain Pd or Bi, and the metal portion 13 may contain Ag or Cu. In this case, Pr or Bi contained in the varistor element body 14 and Pd contained in the buffer portion 12 produce a Pr—Pd alloy or Bi—Pd alloy at the time of firing. Also, ZnO contained in the varistor element body 14 and Bi contained in the buffer portion 12 react with each other, thereby producing a compound. Therefore, the varistor portion 11 and buffer portion 12 are bonded firmly to each other.

Also, Ag or Cu contained in the metal portion 13 and Pd contained in the buffer portion 12 produce an Ag—Pd alloy or Cu—Pd alloy. Ag or Cu contained in the metal portion 13 and Bi contained in the buffer portion 12 produce an Ag—Bi alloy or Cu—Bi alloy. Therefore, the metal portion 13 and buffer portion 12 are bonded firmly to each other. Hence, the varistor portion 11 and metal portion 13 can be joined firmly to each other.

When the buffer portion 12 contains Pd and Bi, Pd and Bi contained in the buffer portion 12, ZnO and Pr or Bi contained in the varistor element body 14, and Ag or Cu contained in the metal portion 13 produce compounds or alloys at a temperature of less than 800° C. Namely, at a temperature of less than 800° C., the varistor portion 11 and buffer portion 12 can be bonded together, and the buffer portion 12 and metal portion 13 can be bonded together. In this case, after forming the varistor portion 11 by firing the above-mentioned green body, the varistor portion 11, buffer portion 12, and metal portion 13 are stacked and heated at a temperature of less than 800° C., whereby the varistor portion 11 and buffer portion 12 can be bonded together, and the buffer portion 12 and metal portion 13 can be bonded together.

Second Embodiment

Figure 3:
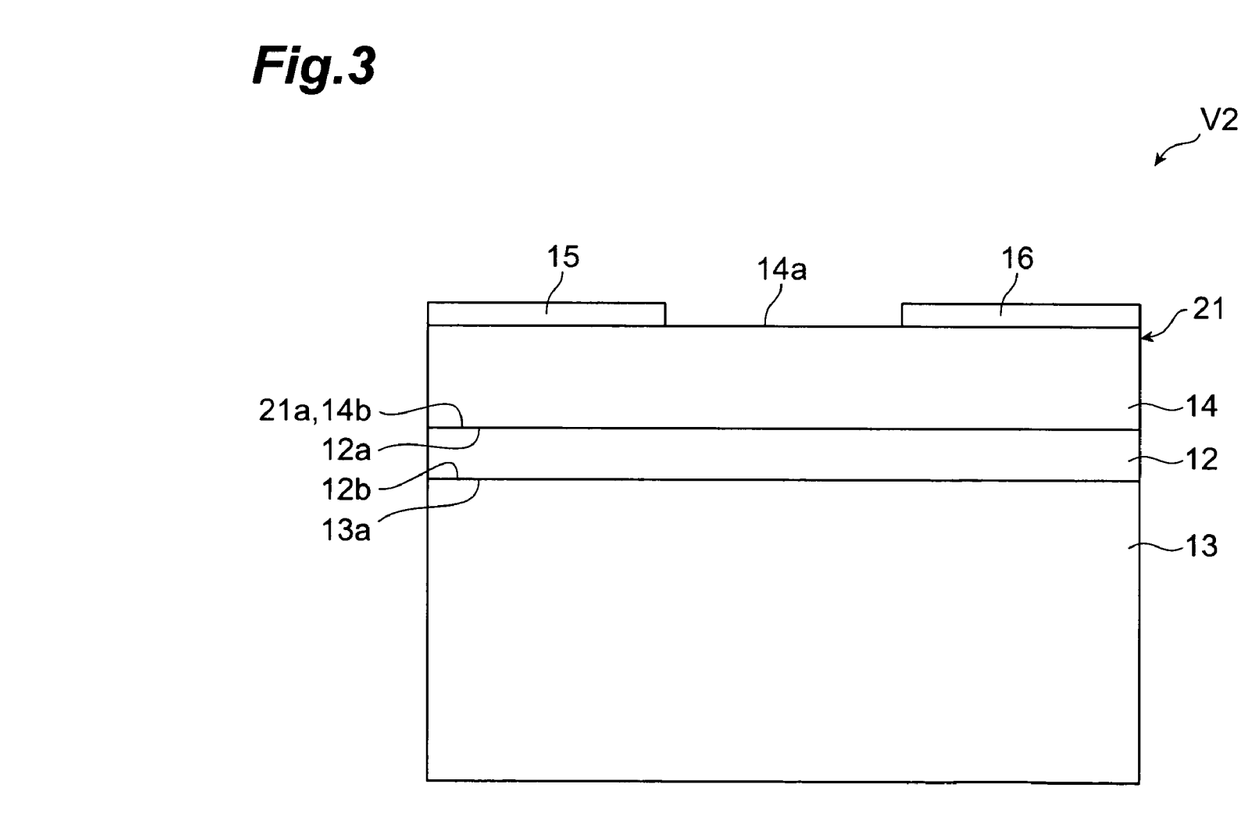
FIG. 3 is a schematic sectional view showing the varistor in accordance with the second embodiment.

With reference to FIG. 3, the configuration of a varistor V2 in accordance with a second embodiment will be explained. FIG. 3 is a schematic sectional view showing the varistor in accordance with the second embodiment. The configuration of the varistor V2 will be explained mainly in terms of differences from the configuration of the varistor V1 mentioned above. The varistor V2 comprises a varistor portion 21 and the above-mentioned buffer portion 12 and metal portion 13. The varistor portion 21 comprises a varistor element body 14, a first electrode portion 15, and a second electrode portion 16. Namely, the varistors V1 and V2 differ from each other in that the varistor V2 is not equipped with the third electrode portion 17. In the varistor portion 21, as mentioned above, the first electrode portion 15 and second electrode portion 16 function as I/O terminals of the varistor V2, while the varistor element body 14 functions as a region exhibiting a nonlinear current-voltage characteristic. In the varistor portion 21, the surface 21a bonded to the buffer portion 12 is a face 14b of the varistor element body 14.

As in the above-mentioned first embodiment, the surface 14b of the varistor portion 21 and the principal face 12a of the buffer portion 12 are bonded to each other. At the bonding surface between the varistor portion 21 and buffer portion 12, Pd contained in the buffer portion 12 and Pr or Bi contained in the varistor element body 14 produce an alloy. Therefore, the buffer portion 12 and varistor element body 14 are bonded firmly to each other. The buffer portion 12 and metal portion 13 are bonded firmly to each other as in the first embodiment. Hence, the metal portion 13 and varistor portion 21 can be joined firmly to each other. Consequently, the heat transmitted to the varistor V2 can efficiently be diffused from the metal portion 13.

Third Embodiment

Figure 4:
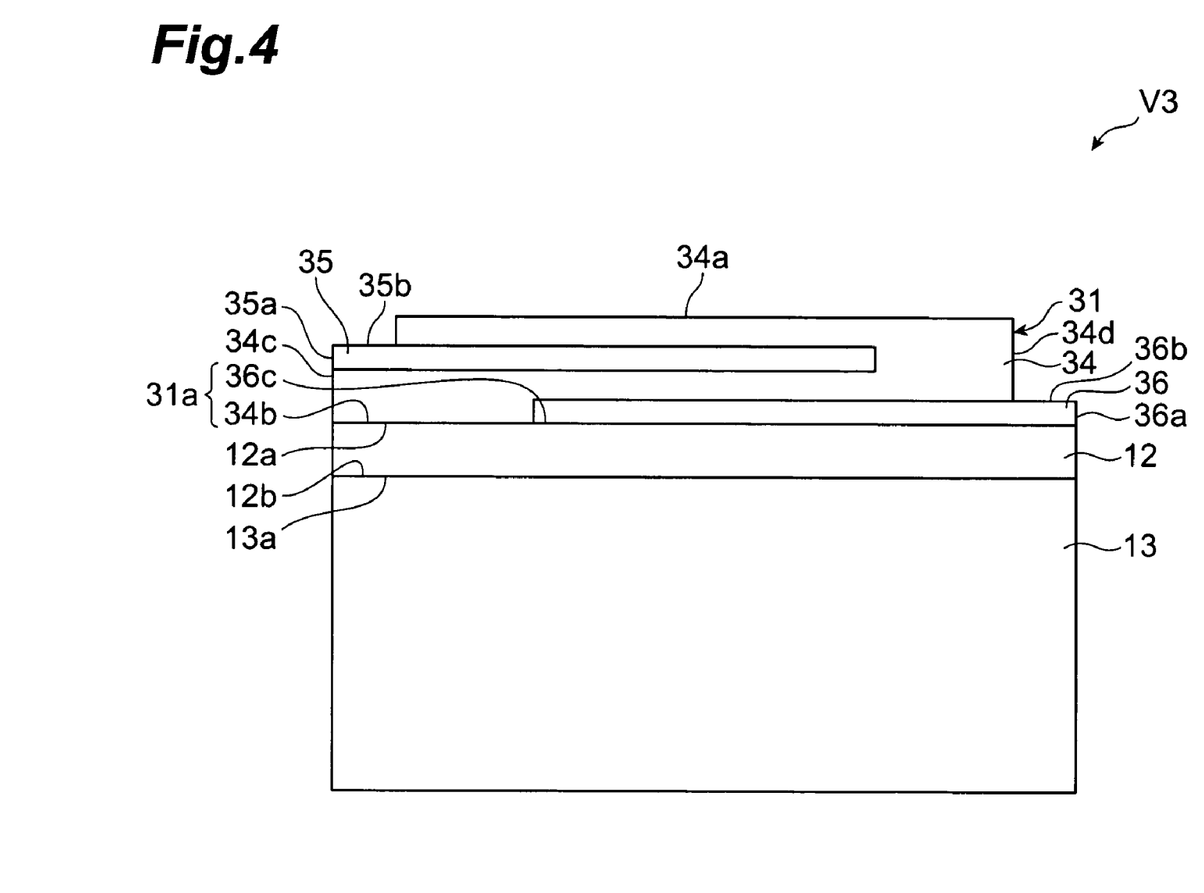
FIG. 4 is a schematic sectional view showing the varistor in accordance with the third embodiment.

With reference to FIG. 4, the configuration of a varistor V3 in accordance with a third embodiment will be explained. FIG. 4 is a schematic sectional view showing the varistor in accordance with the third embodiment. The configuration of the varistor V3 will be explained mainly in terms of differences from the configuration of the varistor V1 mentioned above. The varistor V3 comprises a varistor portion 31 having a configuration different from that of the varistor portion 11 and the above-mentioned buffer portion 12 and metal portion 13. The varistor portion 31 has a substantially rectangular parallelepiped form comprising a varistor element body 34, a first electrode portion 35, and a second electrode portion 36.

The varistor element body 34 is formed into a substantially rectangular parallelepiped shape having faces 34a, 34b opposing each other, side faces 34c, 34d which are perpendicular to the faces 34a, 34b and oppose each other, and two side faces which are adjacent to the side faces 34c, 34d and oppose each other. The varistor element body 34 exhibits a nonlinear current-voltage characteristic as in the first embodiment. The varistor element body 34 is mainly composed of ZnO and contains Pr or Bi as an accessory component.

The first electrode portion 35 and second electrode portion 36 oppose each other and are arranged in the varistor element body 34 while interposing a portion of the varistor element body 34 therebetween. Each of the first electrode portion 35 and second electrode portion 36 is formed like a plate and has a rectangular form when seen in a direction perpendicular to the face 34a of the varistor element body 34.

The first electrode portion 35 and second electrode portion 36 are arranged parallel to the face 34a of the varistor element body 34. The first electrode portion 35 is positioned on the face 34a side of the varistor element body 34, whereas the second electrode portion 36 is positioned on the face 34b side of the varistor element body 34. The first electrode portion 35 and second electrode portion 36 are arranged so as to shift from each other in the direction along which the side faces 34c, 34d oppose each other. The first electrode portion 35 is positioned closer to the side face 34c, whereas the second electrode portion 36 is positioned closer to the side face 34d.

In the first electrode portion 35, the end face 35a closer to the side face 34c of the varistor element body 34 is exposed from the side face 34c of the varistor element body 34. A corner between the face 34a and side face 34c of the varistor element body 34 is cut out, so that, in the principal face 35b closer to the face 34a of the varistor element body 34 in two principal faces of the first electrode portion 35, the portion on the end face 35a side is exposed from the varistor element body 34. The end face opposite to the end face 35a of the first electrode portion 35 is positioned within the varistor element body 34.

In the second electrode portion 36, the end face 36a closer to the side face 34d of the varistor element body 34 is exposed from the side face 34d of the varistor element body 34. A corner between the face 34a and side face 34d of the varistor element body 34 is cut out, so that, in the principal face 36b closer to the face 34a of the varistor element body 34 in two principal faces of the second electrode portion 36, the portion on the end face 36a side is exposed from the varistor element body 34. The end face opposite to the end face 36a of the second electrode portion 36 is positioned within the varistor element body 34.

The principal face 36c of the second electrode portion 36 closer to the face 34b of the varistor element body 34 is exposed from the face 34b of the varistor element body 34. The face 34b of the varistor element body 34 and the principal face 36c of the second electrode portion 36 exposed from the face 34b form one face 31a in the varistor portion 31. The face 31a is a surface opposing the face 34a of the varistor element body 34.

The first electrode portion 35 and second electrode portion 36 are arranged such that they are electrically insulated from each other. Each of the principal faces 35b and 36b of the first electrode portion 35 and second electrode portion 36 is partly exposed from the face 34a of the varistor element body 34.

The first electrode portion 35 and second electrode portion 36 function as I/O terminals of the varistor V3. The first electrode portion 35 and second electrode portion 36 have respective regions opposing each other through a portion of the varistor element body 34 and overlapping each other when seen in a direction perpendicular to the face 34a. In the varistor V3, the region between the first electrode portion 35 and second electrode portion 36 in the varistor element body 34 mainly functions as an area exhibiting a nonlinear current-voltage characteristic.

In this embodiment, the face 31a of the varistor portion 31 and the principal face 12a of the buffer portion 12 are bonded to each other. Namely, the face 34b of the varistor element body 34 and the principal face 12a of the buffer portion 12 are bonded to each other. At the bonding surface between the varistor element body 34 and the buffer portion 12, Pd contained in the buffer portion 12 and Pr or Bi contained in the varistor element body 34 produce an alloy as in the first embodiment. Therefore, the buffer portion 12 and varistor element body 34 are bonded firmly to each other. The buffer portion 12 and metal portion 13 are bonded firmly to each other as in the first embodiment. Hence, the metal portion 13 and varistor portion 31 can be joined firmly to each other.

Consequently, the heat transmitted to the varistor V3 can efficiently be diffused from the metal portion 13.

Fourth Embodiment

Figure 5:
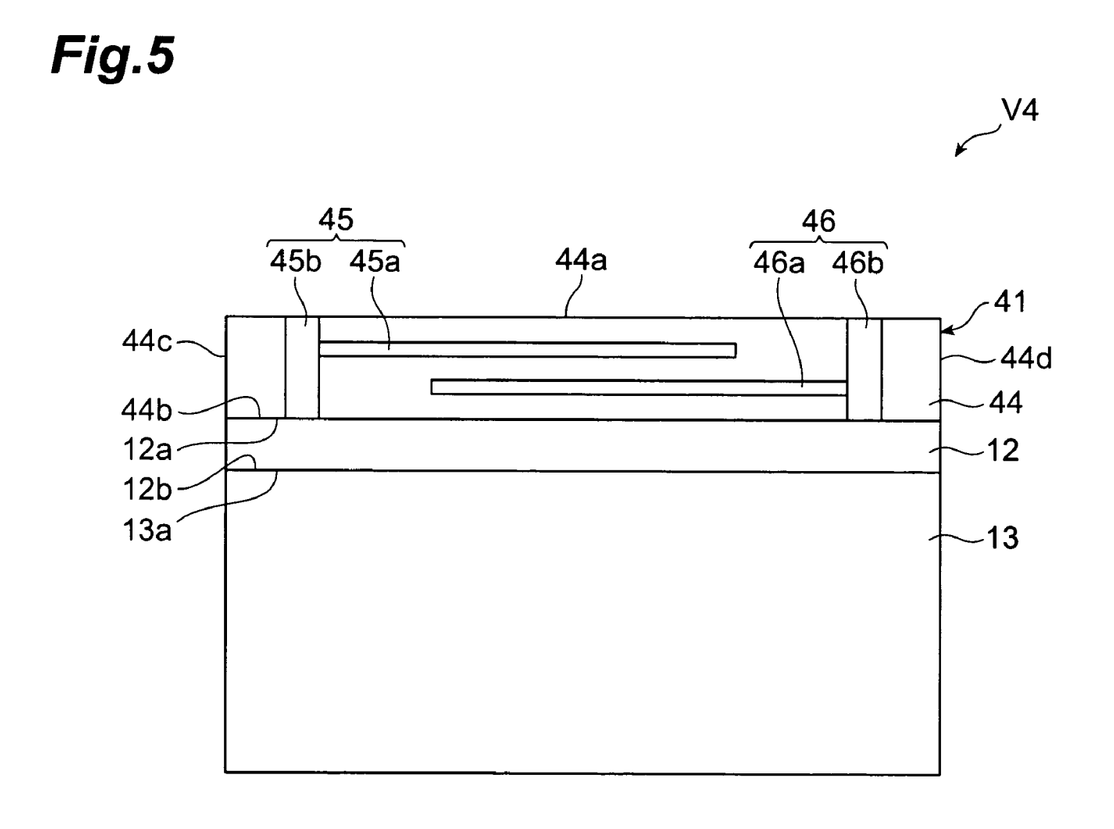
FIG. 5 is a schematic sectional view showing the varistor in accordance with the fourth embodiment.

With reference to FIG. 5, the configuration of a varistor V4 in accordance with the fourth embodiment will be explained. FIG. 5 is a schematic sectional view showing the varistor in accordance with the fourth embodiment. The configuration of the varistor V4 will be explained mainly in terms of differences from the configuration of the varistor V1 mentioned above. The varistor V4 comprises a varistor portion 41 having a configuration different from that of the varistor portion 11 and the above-mentioned buffer portion 12 and metal portion 13. The varistor portion 41 has a substantially rectangular parallelepiped form comprising a varistor element body 44, a first electrode portion 45, and a second electrode portion 46.

The varistor element body 44 is formed into a substantially rectangular parallelepiped shape having faces 44a, 44b opposing each other, side faces 44c, 44d which are perpendicular to the faces 44a, 44b and oppose each other, and two side faces which are adjacent to the side faces 44c, 44d and oppose each other. The varistor element body 44 exhibits a nonlinear current-voltage characteristic as in the first embodiment. The varistor element body 44 is mainly composed of ZnO and contains Pr or Bi as an accessory component.

The first electrode portion 45 has a first internal electrode portion 45a and a conductor portion 45b. The second electrode portion 46 has a second internal electrode portion 46a and a conductor portion 46b. The first internal electrode portion 45a and second internal electrode portion 46a are arranged within the varistor element body 44 such as to oppose each other while interposing a portion of the varistor element body 44 therebetween. Each of the first internal electrode portion 45a and second internal electrode portion 46a is formed like a plate and has a rectangular form when seen in a direction perpendicular to the face 44a of the varistor element body 44. The first internal electrode portion 45a and second internal electrode portion 46a have their outer surfaces wholly covered with the varistor element body 44 and are electrically insulated from each other.

The first internal electrode portion 45a and second internal electrode portion 46a are arranged parallel to the face 44a of the varistor element body 44. The first internal electrode portion 45a is positioned on the face 44a side of the varistor element body 44, whereas the second internal electrode portion 46a is positioned on the face 44b side of the varistor element body 44. The first internal electrode portion 45a and second internal electrode portion 46a are arranged so as to shift from each other in the direction along which the side faces 44c, 44d oppose each other. The first internal electrode portion 45a is positioned closer to the side face 44c, whereas the second internal electrode portion 46a is positioned closer to the side face 44d.

The conductor portion 45b is formed like a plate and has a rectangular form when seen in a direction perpendicular to the side face 44c of the varistor element body 44. The conductor portion 45b has a principal face parallel to the side face 44c of the varistor element body 44, while being positioned within the varistor element body 44 closer to the side face 44c than is the first internal electrode portion 45a.

The conductor portion 45b is connected physically and electrically to the end face of the first internal electrode portion 45a facing the side face 44c of the varistor element body 44. In the conductor portion 45b, one of the opposing end faces is exposed at the face 44a of the varistor element body 44, while the other end face is exposed at the face 44b of the varistor element body 44. The conductor portion 45b is electrically insulated from the conductor portion 46b and second internal electrode portion 46a.

The conductor portion 46b is formed like a plate and has a rectangular form when seen in a direction perpendicular to the side face 44d of the varistor element body 44. The conductor portion 46b has a principal face parallel to the side face 44d of the varistor element body 44, while being positioned within the varistor element body 44 closer to the side face 44d than is the second internal electrode portion 46a.

The conductor portion 46b is connected physically and electrically to the end face of the first internal electrode portion 46a facing the side face 44d of the varistor element body 44. In the conductor portion 46b, one of the opposing end faces is exposed at the face 44a of the varistor element body 44, while the other end face is exposed at the face 44b of the varistor element body 44. The conductor portion 46b is electrically insulated from the conductor portion 45b and first internal electrode portion 45a.

The first electrode portion 45 and second electrode portion 46 are arranged such that they are electrically insulated from each other. Each of the conductor portions 45b, 46b of the first electrode portion 45 and second electrode portion 46 has one end face exposed from the face 44a of the varistor element body 44.

The conductor portions 45b, 46b function as I/O terminals of the varistor V4. The first internal electrode portion 45a and second internal electrode portion 46a have respective regions opposing each other through a portion of the varistor element body 44 and overlapping each other when seen in a direction perpendicular to the face 44a. In the varistor V4, the region between the first internal electrode portion 45a and second internal electrode portion 46a in the varistor element body 44 mainly functions as an area exhibiting a nonlinear current-voltage characteristic.

In this embodiment, the face 44b of the varistor portion 41 and the principal face 12a of the buffer portion 12 are bonded to each other. At the bonding surface between the varistor portion 41 and the buffer portion 12, Pd contained in the buffer portion 12 and Pr or Bi contained in the varistor element body 44 produce an alloy as in the first embodiment. Therefore, the buffer portion 12 and varistor element body 44 are bonded firmly to each other. The buffer portion 12 and metal portion 13 are bonded firmly to each other as in the first embodiment. Hence, the metal portion 13 and varistor portion 41 can be joined firmly to each other. Consequently, the heat transmitted to the varistor V4 can efficiently be diffused from the metal portion 13.

Fifth Embodiment

Figure 6:
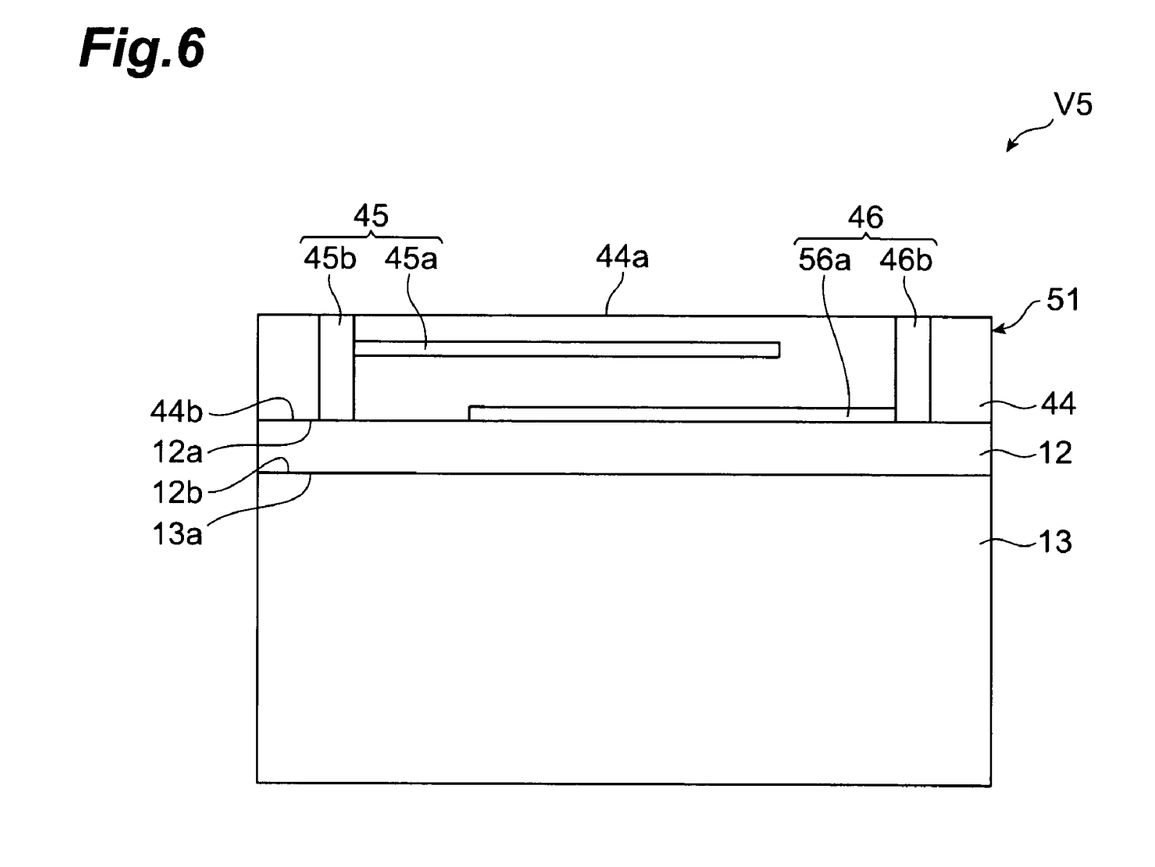
FIG. 6 is a schematic sectional view showing the varistor in accordance with the fifth embodiment.

With reference to FIG. 6, the configuration of a varistor V5 in accordance with a fifth embodiment will be explained. FIG. 6 is a schematic sectional view showing the varistor in accordance with the fifth embodiment. The configuration of the varistor V5 will be explained mainly in terms of differences from the configuration of the varistor V4 mentioned above. The varistor V5 comprises a varistor portion 51 having a configuration different from that of the varistor portion 41 and the above-mentioned buffer portion 12 and metal portion 13.

The varistor portion 51 has a second internal electrode portion 56a in place of the second internal electrode portion 46a of the above-mentioned varistor portion 41. In the varistor portion 51, the second internal electrode portion 56a is arranged at a position different from that of the second internal electrode portion 46a of the varistor portion 41. The second internal electrode portion 56a is arranged such that, in its principal faces opposing each other, the principal face on the outer side of the varistor element body 44 is exposed at the face 44b of the varistor element body 44. Namely, in the opposing principal faces of the second internal electrode portion 56a, the principal face on the outer side of the varistor element body 44 is bonded to the principal face 12a of the buffer portion 12.

In the varistor V5, the conductor portions 45b, 46b function as I/O terminals of the varistor V5 as in the varistor V4. The first internal electrode portion 45a and second internal electrode portion 56a have respective regions opposing each other through a portion of the varistor element body 44 and overlapping each other when seen in a direction perpendicular to the face 44a. In the varistor V5, the region between the first internal electrode portion 45a and second internal electrode portion 56a in the varistor element body 44 mainly functions as an area exhibiting a nonlinear current-voltage characteristic.

In this embodiment, the face 44b of the varistor element body 44 and the principal face 12a of the buffer portion 12 are bonded to each other. At the bonding surface between the varistor element body 44 and buffer portion 12, Pd contained in the buffer portion 12 and Pr or Bi contained in the varistor element body 44 produce an alloy as in the first embodiment. Therefore, the buffer portion 12 and varistor element body 44 are bonded firmly to each other. The buffer portion 12 and metal portion 13 are bonded firmly to each other as in the first embodiment. Hence, the metal portion 13 and varistor portion 51 can be joined firmly to each other. Consequently, the heat transmitted to the varistor V5 can efficiently be diffused from the metal portion 13.

Sixth Embodiment

Figure 7:
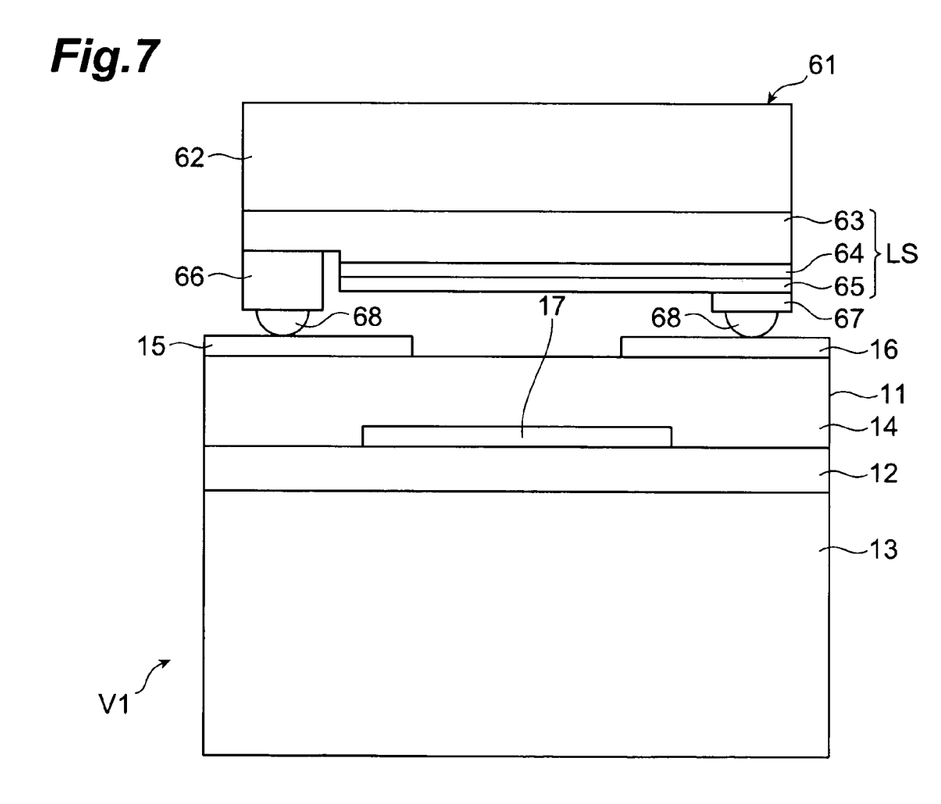
FIG. 7 is a schematic sectional view showing the light-emitting apparatus in accordance with the sixth embodiment.

With reference to FIG. 7, the configuration of a light-emitting apparatus LE in accordance with a sixth embodiment will be explained. FIG. 7 is a schematic sectional view showing the light-emitting apparatus in accordance with the sixth embodiment. The light-emitting apparatus LE comprises the above-mentioned varistor V1 and a semiconductor light-emitting device 61 electrically connected to the varistor V1, for example. FIG. 7 shows a cross-sectional configuration of the light-emitting apparatus LE taken along a plane including the third electrode portion 17.

The semiconductor light-emitting device 61 is a light-emitting diode (LED) made of a semiconductor based on GaN (gallium nitride) comprising a substrate 62 and a layer structure LS formed on the substrate 62. The GaN-based semiconductor LED has been known well, and thus will be explained only in brief. The substrate 62 is an optically transparent, electrically insulating substrate made of sapphire. The layer structure LS includes an n-type (first conductivity type) semiconductor region 63, a light-emitting layer 64, and a p-type (second conductivity type) semiconductor region 65 which are laminated. The semiconductor light-emitting device 61 emits light according to a voltage applied between the n-type semiconductor region 63 and the p-type semiconductor region 65.

The n-type semiconductor region 63 contains an n-type nitride semiconductor. In this embodiment, the n-type semiconductor region 63 is formed by epitaxially growing GaN on the substrate 62 and is doped with an n-type dopant such as Si, for example, so as to exhibit n-type conductivity. The n-type semiconductor region 63 may have such a composition as to yield a smaller refractive index and greater bandgap as compared with the light-emitting layer 64. In this case, the n-type semiconductor region 63 acts as a lower cladding for the light-emitting layer 64.

The light-emitting layer 64 is formed on the n-type semiconductor region 63, and emits light in its light-emitting region when carriers (electron and hole) supplied from the n-type semiconductor region 63 and p-type semiconductor region 65 are recombined. The light-emitting layer 64 may have a multiple quantum well (MQW) structure in which barrier and well layers are alternately laminated over a plurality of periods, for example. In this case, the barrier and well layers are made of InGaN, while their In (indium) compositions are appropriately selected such that the barrier layers have a bandgap greater than that of the well layers. The light-emitting region is generated in an area where the carriers are injected in the light-emitting layer 64.

The p-type semiconductor region 65 contains a p-type nitride semiconductor. In this embodiment, the p-type semiconductor region 65 is formed by epitaxially growing AlGaN on the light-emitting layer 64 and is doped with a p-type dopant such as Mg, for example, so as to exhibit p-type conductivity. The p-type semiconductor region 65 may have such a composition as to yield a smaller refractive index and greater bandgap as compared with the light-emitting layer 64. In this case, the p-type semiconductor region 65 acts as an upper cladding for the light-emitting layer 64.

A cathode electrode 66 is formed on the n-type semiconductor region 63. The cathode electrode 66 is made of a conductive material, and realizes an ohmic contact with the n-type semiconductor region 63. An anode electrode 67 is formed on the p-type semiconductor region 65. The anode electrode 67 is made of a conductive material, and realizes an ohmic contact with the p-type semiconductor region 65. The cathode electrode 66 and anode electrode 67 are formed with bump electrodes 68.

When a predetermined voltage is applied between the anode electrode 67 (bump electrode 68) and cathode electrode 66 (bump electrode 68), so as to cause a current to flow, light is emitted in the light-emitting region of the light-emitting layer 64 in the semiconductor light-emitting device 61 having the configuration mentioned above.

The semiconductor light-emitting device 61 is bump-connected to the first electrode portion 15 and second electrode portion 16. Namely, the cathode electrode 66 is connected electrically and physically to the first electrode portion 15 through the bump electrode 68. The anode electrode 67 is connected electrically and physically to the second electrode portion 16 through the bump electrode 68. Consequently, the varistor V1 is connected in parallel to the semiconductor light-emitting device 61. Therefore, the varistor V1 can protect the semiconductor light-emitting device 61 against ESD surges.

In the light-emitting apparatus LE, the bump electrodes 68 of the semiconductor light-emitting device 61 are physically connected to the first electrode portion 15 and second electrode portion 16 of the varistor V1, respectively, and thus are thermally connected thereto. Therefore, the heat generated in the semiconductor light-emitting device 61 is transmitted to the varistor V1 through the bump electrodes 68 and first and second electrode portions 15, 16. Since the varistor V1 is constructed such that each of the varistor portion 11 and metal portion 13 is bonded to the buffer portion 12, the buffer portion 12 and metal portion 13 can be bonded firmly to each other, while the buffer portion 12 and varistor portion 11 can be bonded firmly to each other. Therefore, the metal portion 13 and varistor portion 11 can be joined firmly to each other. Hence, the heat transmitted to the varistor V1 can efficiently be diffused from the metal portion 13.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A varistor comprising:
   a varistor portion having a varistor element body exhibiting a nonlinear current-voltage characteristic and two electrode portions;
   a metal portion having a thermal conductivity higher than that of the varistor element body; and
   a buffer portion disposed between the varistor portion and metal portion so as to be bonded to each of the varistor portion and metal portion and mainly composed of glass;
   wherein the two electrode portions are arranged in the varistor element body so as to be electrically insulated from each other while exposing at least a portion of each thereof from an outer surface of the varistor element body.

2. A varistor according to claim 1,
   wherein a bonding surface of the metal portion with the buffer portion is a rough surface.

3. A varistor according to claim 1,
   wherein the buffer portion contains a material adapted to produce a compound or alloy with a material contained in the varistor element body and produce a compound or alloy with a material contained in the metal portion.

4. A varistor according to claim 3,
   wherein a bonding surface of the metal portion with the buffer portion is a rough surface.

5. A varistor according to claim 3,
   wherein the material contained in the buffer portion is Pd or Bi.

6. A varistor according to claim 5,
   wherein a bonding surface of the metal portion with the buffer portion is a rough surface.

7. A light-emitting apparatus comprising a semiconductor light-emitting device and a varistor;
   the varistor comprising:
   a varistor portion having a varistor element body exhibiting a nonlinear current-voltage characteristic and two electrode portions;
   a metal portion having a thermal conductivity higher than that of the varistor element body; and
   a buffer portion disposed between the varistor portion and metal portion so as to be bonded to each of the varistor portion and metal portion and mainly composed of glass;
   wherein the two electrode portions are arranged in the varistor element body so as to be electrically insulated from each other while exposing at least a portion of each thereof from an outer surface of the varistor element body; and
   wherein the semiconductor light-emitting device is connected physically and electrically to the two electrode portions so as to be connected in parallel to the varistor.

8. A light-emitting apparatus according to claim 7,
   wherein a bonding surface of the metal portion with the buffer portion is a rough surface.

9. A light-emitting apparatus according to claim 7,
   wherein the buffer portion contains a material adapted to produce a compound or alloy with a material contained in the varistor element body and produce a compound or alloy with a material contained in the metal portion.

10. A light-emitting apparatus according to claim 9,
    wherein a bonding surface of the metal portion with the buffer portion is a rough surface.

11. A light-emitting apparatus according to claim 9,
    wherein the material contained in the buffer portion is Pd or Bi.

12. A light-emitting apparatus according to claim 11,
    wherein a bonding surface of the metal portion with the buffer portion is a rough surface.

* * * * *